US006809044B1

(12) United States Patent
Aspar et al.

(10) Patent No.: US 6,809,044 B1
(45) Date of Patent: Oct. 26, 2004

(54) METHOD FOR MAKING A THIN FILM USING PRESSURIZATION

(75) Inventors: Bernard Aspar, Rives (FR); Michel Bruel, Veurey (FR); Hubert Moriceau, Saint Egreve (FR)

(73) Assignee: Commissariat a l'energie Atomique, Paris (FR)

( * ) Notice: Subject to any disclaimer, the term of this patent is extended or adjusted under 35 U.S.C. 154(b) by 0 days.

(21) Appl. No.: 10/018,757

(22) PCT Filed: Jun. 29, 2000

(86) PCT No.: PCT/FR00/01828

§ 371 (c)(1),
(2), (4) Date: Mar. 20, 2002

(87) PCT Pub. No.: WO01/03171

PCT Pub. Date: Jan. 11, 2001

(30) Foreign Application Priority Data

Jun. 30, 1999 (FR) .............................. 99 08379

(51) Int. Cl.[7] .............................................. H01L 21/425
(52) U.S. Cl. ........................ 438/977; 438/120; 438/15
(58) Field of Search ................................ 438/977, 120, 438/15, 117, 457, 528, 118, 455, 974, 456, 458, 25, 26, 27; 156/633

(56) References Cited

U.S. PATENT DOCUMENTS 4,846,931 A * 7/1989 Gmitter et al. ............... 438/26
5,250,460 A * 10/1993 Yamagata et al. ........... 438/458
5,374,564 A * 12/1994 Bruel .......................... 438/455
6,387,829 B1 * 5/2002 Usenko et al. .............. 438/120

FOREIGN PATENT DOCUMENTS

EP      0 533 551 A1    3/1993
EP      0 905 767 A1    3/1999

OTHER PUBLICATIONS

PCT International Application No. WO 98/52216, Int'l. Pub. Date: Nov. 19, 1998.
International Search Report PCT/FROO/01828.

* cited by examiner

*Primary Examiner*—Carl Whitehead, Jr.
*Assistant Examiner*—Laura M Schillinger
(74) *Attorney, Agent, or Firm*—Linda M. Deschere, Esq.

(57) ABSTRACT

The invention relates to a process for making a thin film starting from a substrate (1) of a solid material with a plane face (2) comprising:
the implantation of gaseous compounds in the substrate (1) to make a layer of micro-cavities (4) at a depth from the said plane face (2) corresponding to the thickness of the required thin film, the gaseous compounds being implanted under conditions that could weaken the substrate at the layer of micro-cavities,
partial or total separation of the thin film from the rest of the substrate (1), this separation comprising a step in which thermal energy is added and pressure is applied to the said plane face (2).

20 Claims, 1 Drawing Sheet

METHOD FOR MAKING A THIN FILM USING PRESSURIZATION

TECHNICAL FIELD

This invention relates to a process for making a thin film of solid material. In particular it relates to the production of a thin film made of a semi-conducting material, for example such as silicon.

STATE OF PRIOR ART

Document FR-A-2 681 472 (corresponding to U.S. Pat. No. 5,374,564) discloses a process for manufacturing thin films made of a semi-conducting material. This document divulges that implantation of a rare gas and/or hydrogen in a substrate made of a semi-conducting material could create a layer that could contain micro-cavities or micro-bubbles (or platelets) at a depth approximately equal to the average penetration depth of the implanted ions. The implanted face of this substrate is brought into intimate contact with a support acting as a stiffener. Furthermore, heat treatment can be applied at a sufficiently high temperature to induce an interaction (or coalescence) between the micro-cavities or micro-bubbles causing a separation of the semi-conducting substrate into two parts, namely a thin semi-conducting film bonding to the stiffener, and secondly the rest of the semi-conducting substrate. The separation takes place at the location at which the micro-cavities or micro-bubbles are present, in other words along the micro-cavities layer. The heat treatment is such that the interaction between the micro-bubbles or the micro-cavities created by implantation causes a separation between the thin film and the rest of the substrate. Therefore, there is a transfer of a thin film from an initial substrate as far as a stiffener that acts as a support for this thin film.

This process may also be applied to the manufacture of a thin film made of solid material other than a semi-conducting material (a conducting or dielectric material) that may or may not be crystalline. This film may be single layer or multi-layer.

Thus, the implantation of gaseous compounds can create in-depth cavities or micro-bubbles or micro-cracks that will form a weakened layer close to the depth at which the ions stop. The implanted zone is more or less fragile depending on the nature and implantation conditions. They are chosen such that the implanted surface of the substrate is not deformed in any way. If any deformations in this surface occur in the form of blisters, these deformations will cause excessive weakening of the implanted zone.

Document FR-A-2 681 472 describes how, in order to transfer a thin film onto a support, the implanted substrate and the support (or stiffener) have to be bonded together before causing separation of the thin film from its original substrate, this separation possibly being caused by a heat treatment and/or a mechanical treatment (as described in document FR-A-2 748 851). Bonding is achieved by putting the implanted substrate and the support into intimate contact by means of molecular bonding, or a glue or an intermediate compound (insulating layer, conducting layer, etc.). This bonding is only possible if there are no deformations on the implanted surface, and therefore if no blisters have occurred.

In some cases, it is impossible to bond the implanted substrate and the support acting as a stiffener, particularly due to different coefficients of thermal expansion. It is also possible that the bonding forces are not sufficient to cause the stiffening effect. Therefore a thin film, for example a mono-crystalline film, can be obtained on any support using a process derived from the process divulged by document FR-A-2 681 472, for example the process divulged by document FR-A-2 738 671 (corresponding to U.S. Pat. No. 5,714,395). According to this process, the implanted gaseous compounds rust be at a sufficient depth and/or a layer of a material able to make the structure sufficiently rigid to obtain separation at the implanted zone must be deposited after the implantation step, in order to separate the thin film from its original substrate. The film obtained is then self supporting.

For the two processes mentioned above, the surface roughness of the thin film after transfer is variable depending on the implantation and/or separation conditions (heat and/or mechanical treatment) used to obtain this separation. In this case it may be useful to further weaken the zone containing the cavities. Separation would then be easier than in the normal case, in other words separation would be possible by applying lower mechanical forces and and/or a smaller thermal budget. This is particularly useful for structures composed of materials with different coefficients of thermal expansion and for which there are limiting heating temperatures.

The various means of weakening the implanted zone include an increase in the dose of implanted gaseous compounds and/or carrying out a heat treatment that may correspond to the heat treatment divulged in document FR-A-2 681 472. However, as mentioned above, the implanted dose and/or the thermal budget need to be limited before the bonding step in order to prevent deformations of the implanted surface.

Thus, there is no acceptable means of further weakening the implanted zone before applying the separation step. The existence of such a means would make it possible Go reduce thermal budgets and/or the mechanical forces necessary for separation. Thus, thin films could be transferred onto supports that cannot resist high temperatures, by using the process divulged in document FR-A-2 681 472. It would also be possible to more easily separate thick films using the process described in document FR-A-2 738 671. These thick films could then be transferred onto any type of support, even supports for which it would be impossible to obtain high bonding forces between the film and the support. Furthermore, increased weakening of the implanted zone would make it possible to reduce the roughness of the free surface of the film after transfer, while encouraging fracture.

Therefore, the problem that arises is to further weaken the implanted zone without inducing any blisters on the implanted surface of the original substrate.

PRESENTATION OF THE INVENTION

The invention provides a solution to this problem. It is proposed to apply pressure on the implanted face of the substrate, at least during part of the coalescence of micro-cavities, in order to facilitate this coalescence and prevent implanted gaseous compounds from escaping from the substrate. The result is that weakening is increased.

Therefore, the purpose of the invention is a process for making a thin film from a substrate of a solid material with a plane face, comprising:

the implantation of gaseous compounds in the substrate to form a layer of micro-cavities located at a depth from the said plane face corresponding to the thickness of the required thin film, the gaseous compounds being implanted under conditions that can weaken the substrate at the layer of micro-cavities, partial or complete separation of the thin film from the rest of the substrate, this separation comprising a step in which thermal energy is input and in which pressure is applied to the said plane face.

The "Mechanistic Studies of Silicon Wafer Bonding and Layer Exfoliation" document by M. K. WELDON et al., published in Electrochemical Society Proceedings, volume 97–36, specifies that application of a compression stress on a glued structure composed of an implanted substrate and a stiffener is a means of closing micro-cracks and preventing exfoliation, while a uniform external tension can cause exfoliation at a lower temperature. It also mentions that application of a uniform pressure at lower temperatures is a means of developing more uniform micro-cracks such that a more uniform exfoliation can be obtained when the pressure is released and heat is applied. In this document, the applied pressure is a means of obtaining uniform micro-cracks but does not provide any information about increased weakening of the implanted zone by an increase in the size of micro-cracks. Thus, in this document, exfoliation is achieved by releasing the pressure and applying heat at a temperature a priori greater than the temperature used when the pressure was applied. In this document, unlike the case in this invention, the applied pressure is not used to increase weakening of the implanted zone and therefore to reduce the thermal budget and/or mechanical forces in order to obtain the thin film. Furthermore according to this invention, separation may be achieved under pressure. Moreover, according to one advantageous embodiment of the invention, the applied pressure may be adjusted during the process depending on changes to the gaseous phases present in the micro-cavities.

Gaseous compounds for the purposes of this description means elements, for example hydrogen or rare gases, either in their atomic form (for example H) or in their molecular form (for example $H_2$) or in their ionic form (for example $H^+$, $H^+_2$) or in their isotopic form (for example deuterium) or in isotopic and ionic form.

Furthermore, ionic implantation refers to any type of introduction of the previously defined compounds alone or in combination, such as ionic bombardment, diffusion, etc.

Regardless of the type of solid material, thermal energy causes coalescence of micro-cavities or micro-cracks which causes weakening of the structure at the micro-cavities layer. This weakening enables separation of the material under the effect of internal stresses and/or pressure in the micro-cavities, and this separation may be natural or may be assisted by the application of external stresses.

Applying pressure is a means of causing coalescence of micro-cavities while preventing the formation of blisters on the plane face. This pressure depends on the state of stress in the implanted zone.

Partial separation means separation in which attachment points are left between the thin film and the rest of the substrate.

The said pressure may be a gas pressure and/or a mechanical pressure applied for example by a piston. It may be applied locally or uniformly over the plane face.

The process may also comprise bonding of a thickener on the said plane face, after implantation of gaseous compounds. The thickener may consist of a wafer that may, for example, be bonded with the said plane face by molecular bonding. The thickener may also be composed of a deposit of one or several materials. Pressure can then be applied through the thickener. This thickener acts as a stiffener. In this case, the pressure that encourages coalescence of micro-cavities and prevents the formation of blisters takes account of the thickener. The thickener can induce stresses on the structure, encouraging the coalescence of micro-cavities.

Advantageously, while some of the micro-cavities are coalescing, the said pressure as adjusted to remain slightly higher than a pressure called the limiting pressure, below which blisters appear on the said plane face and above which blisters do not appear on the said plane face. This avoids applying unnecessarily high pressures.

The limiting pressure changes in time as the coalescence of micro-cavities varies. Thus, the pressure used according to the invention may be the maximum limiting pressure or it may be a limiting pressure that is applied gradually during the process and that varies as a function of the coalescence of the micro-cavities that in particular depends on the thermal budget (time, temperature). Therefore, the limiting pressure depends on the thermal budget. Thus, for example, for annealing a 300 nm Si film and a 5 µm $SiO_2$ film at 450° C. for a given duration, a pressure of the order of a few bars has to be applied in order to achieve separation, whereas if there is no additional pressure (in other words at atmospheric pressure) annealing at more than 470° C. is necessary to achieve separation and obtain a film.

Coalescence may be achieved such that the thin film can be separated from the rest of the substrate simply by pulling them apart.

According to another embodiment, the thin film is separated from the rest of the substrate by applying a heat treatment and/or mechanical forces.

The initial substrate may be a substrate that has already been used to make a thin film according to the process. For example, this substrate that has already been used may be polished to provide a new plane face.

The substrate may comprise one or several homogenous and/or heterogeneous layers on the side of the said plane face. It may be composed of a semi-conducting material, at least on the side of the said plane face. It may comprise all or part of at least one electronic device and/or at least one electro-optical device, on the side of the said plane face.

Due to the applied pressure, the invention can result in thinner self supporting films than are possible with a process without pressure. This pressure prevents the relaxation of micro-cavities in the form of blisters and enables these micro-cavities to interact to cause separation.

The invention can also be used to delay separation of the thin film by the use of an additional step that consists of applying additional pressure on the thin film.

BRIEF DESCRIPTION OF THE DRAWINGS

The invention will be better understood and other advantages and specific features will become clearer after reading the following description given as a non-limitative example with the attached drawings in which.

DETAILED DESCRIPTION OF EMBODIMENTS OF THE INVENTION

The principle used in the invention is based on the use of pressure during one or several heat treatments to weaken the implanted zone while preventing the formation of blisters.

Coalescence may be achieved by combining a heat treatment cycle associated with a pressurization cycle in order to increase the weakening phenomenon without creating blisters on the implanted face. The pressure may be a gas pressure. The weakening phenomenon may be continued until complete separation of the two parts of the substrate. The substrate weakening process at the ion implantation depth continues while coalescence is taking place, and it may go beyond the limits possible with a simple heat treatment. The pressure applied on the implanted face of the substrate makes this result possible by preventing the formation of blisters on the implanted face and also by preventing some blisters from bursting as can occur if there is no applied pressure. The result is that the substrate is much weakened along the layer of micro-cavities.

Figure 1:
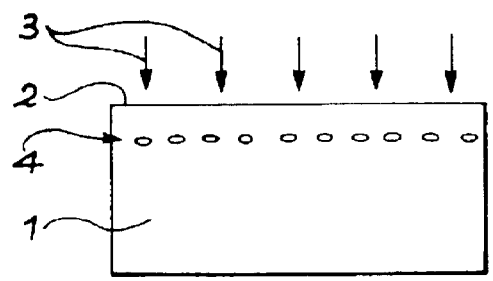
FIGS. 1 to 3 diagrammatically illustrate the different steps in the process for making a thin film according to this invention.
Figure 2:
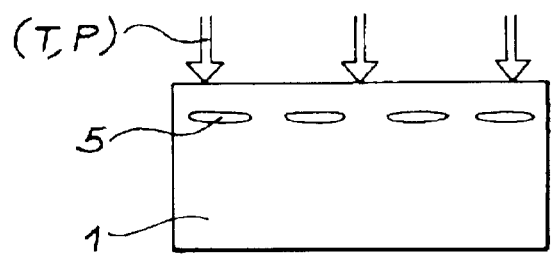
Figure 3:
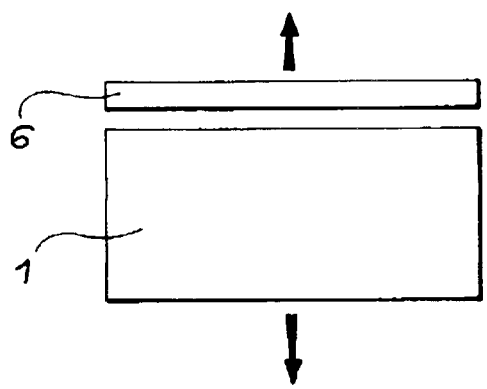

FIGS. 1 to 3 show transverse views of a semi-conducting substrate to which the process according to the invention is applied.

The semi-conducting substrate 1 has a plane face 2. A plane face means a face for which the average surface is plane. This includes wafers that have a surface micro-roughness with roughness values varying from a few tens of nanometers to several hundred nanometers. The inventors of this invention have demonstrated that implantation through a surface with a micro-roughness with an RMS (root mean square) value of 10 nm, for example, does not disturb the weakening mechanism and the subsequent fracture. This observation is useful, since this roughness is of the order of magnitude of the roughness of the free face of the film after the transfer. Therefore under these conditions, it is possible to recycle the same substrate several times without the need for surface polishing. In some cases, this face may have a topology that will be eliminated during surface preparation, for example by mechanical-chemical polishing.

FIG. 1 illustrates the step in which gaseous compounds are implanted. The plane face 2 is bombarded, for example by hydrogen ions, as described in document FR-A-2 681 472. This ionic bombardment is illustrated by arrows 3. This thus creates a micro-cavities layer 4.

The process according to the invention may also comprise an operation to thicken the required thin film. For example, after the implantation step, it would be possible to add a wafer on the implanted face of the substrate, by molecular bonding or by another type of bonding processes. This can be done using equipment that puts the substrate and the wafer into contact in a pressurized chamber. Pressure can then be applied on the plane face of the substrate while the thickening wafer is being bonded.

This thickening operation may advantageously be done using a process derived from the process described in document FR-A-2 739 671. For example, a set of materials can be deposited on the plane face of the substrate to make it more rigid. These deposits may be epitaxial or heteroepitaxial growths or deposits of amorphous or polycrystalline materials. For example silicon may be deposited on the plane face of a previously implanted substrate. The added material may be qualified as a thickener, regardless of whether it is bonded or deposited.

For given experimental conditions (materials, ions, dose, energy, implantation and annealing temperature), there is a limiting value for the pressure applied to the plane face of the substrate, $P_{limit}$, for each thickness of the thin film (thickened or not thickened), below which blisters will appear on the plane face and above which blisters will not appear on the plane face. For example, $P_{limit}$ is equal to 20 bars for a total silicon thickness equal to 2 $\mu$m and is equal to atmospheric pressure for 5 $\mu$m of silicon. Therefore, when performing the coalescence step according to the invention, it is possible to adjust the pressure while this step is being carried out so that the pressure remains close to $P_{limit}$. This avoids the application of unnecessarily high pressures.

$P_{limit}$ also depends on the remaining quantity of gaseous compounds added during the ionic implantation. This quantity of gas may vary with time due to gas diffusion, particularly due to temperature, and due to the fact that micro-cavities that contain this gas become larger. The limiting pressure is a means of avoiding the formation of blisters, but it must not limit the growth of cavities or micro-cracks present close to the implantation depth. When the size of the micro-cracks increases, the same quantity of gas occupies a larger volume and consequently $P_{limit}$ reduces. It is thus possible to determine a step in which coalescence is carried out such that the pressure exerted and the limiting pressure each follow a cycle that begins and ends at atmospheric pressure. The actually applied pressure remains higher than or equal to the limiting pressure. Therefore a weakened layer is recovered at the end of the cycle, at atmospheric pressure.

Under some conditions, the substrate can be fully separated into two parts during the coalescence step. In this case, the cycle is terminated.

Figure 4:
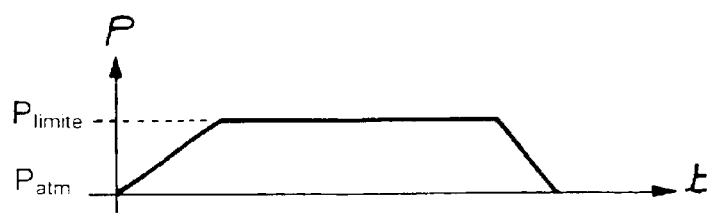
FIG. 4 is a diagram showing the variation of the pressure applied to the implanted face of a substrate during a step in the process for making a thin film according to this invention, as a function of time.

FIG. 2 illustrates the micro-cavities coalescence step due to the addition of thermal energy T and application of pressure P. For example, the applied pressure corresponds to the cycle in the diagram in FIG. 4, representing the variation of the pressure P as a function of time t. The applied pressure follows the atmospheric pressure ($P_{atm}$)—limiting pressure ($P_{limit}$)—atmospheric pressure ($P_{atm}$) cycle. Micro-cavities tend to coalesce to form micro-cracks 5.

FIG. 3 illustrates the separation step after which a thin film 6 is detached from the rest of the substrate 1. Two cases can arise after the previous step; firstly the film may be not entirely separated from the substrate, or it may be entirely separated from it.

The process may be carried out such that the thin film is not entirely separated from its original substrate; In this case, the thin film may for example be recovered by means of a stiffening support as described in document FR-A-2 681 472, that is fixed to the implanted face of the substrate. With this invention, this recovery is easier since the implanted zone is more weakened. This means that the thermal budgets necessary are lower and/or the necessary tear off energy is lower. The advantage of a lower thermal budget (time and/or temperature) is the possibility of combining materials with different coefficients of thermal expansion. The advantage of a lower tear off energy is the possibility of choosing a lower bond energy of the stiffener, to facilitate subsequent separation of the thin film and the stiffener according to the description given in document FR-A-2 725 074.

For example, this stiffening substrate may be a silicon wafer, or a flexible film for example made of polymer or ceramic. The wafer may be bonded onto the stiffener by means of a glue or molecular bonding, possibly by means of an interface layer for example such as an $SiO_2$ layer.

The process may be carried out such that the thin film is completely separated from its original substrate. Bonding of a stiffening support may not always be necessary. A self supporting film can be obtained as described in document FR-A-2 738 671. However, thin films according to the invention can be obtained with much lower thicknesses. For example, in the case of mono-crystalline silicon, the minimum energy necessary to achieve ionic implantation according to document FR-A-2 738 671 is 500 keV. According to the invention, application of a pressure of 20 bars can lower the minimum implantation energy (to avoid the use of a stiffener) to about 150 keV. Standard implanters can then be used.

As an example, we will now describe how a silicon film is obtained according to this invention. The plane face of a silicon substrate is bombarded by protons at a dose that could cause the appearance of blisters on the bombarded face during a heat treatment at 500° C. This dose may be of the order of $10^{17}$ cm$^{-2}$ for an implantation energy of 150 keV. In a first phase, a conventional heat treatment is carried out to activate the micro-cavity growth mechanism (for example at 250° C. for 2 hours) . It is not necessary to apply pressure in this first phase, since coalescence of the micro-cavities is not sufficient to cause the formation of detectable blisters; the limiting pressure is less than or equal to the atmospheric pressure. In a second phase, the implanted face of the substrate is pressurized (20 bars) and the temperature is increased from 300 to 400° C. in 15 minutes and is then kept constant for one hour. The result is total separation between the two parts of the substrate. The temperature is then lowered and the pressure is reduced to atmospheric pressure. The thin film can then be recovered.

If a stiffening support is used, the implanted zone is weakened under pressure and the temperature is reduced to lower the pressure induced by the amount of gas and the temperature. It is necessary to allow for the fact that reducing the temperature causes a significant reduction in the internal pressure in the micro-cavities or the micro-cracks.

This process according to the invention has many advantages. It is a means of obtaining fractures with lower roughnesses than are possible using processes according to known art. This can reduce the thickness that may need to be removed by polishing, for example when making Silicon On Insulator (SOI) substrates. Polishing introduces a dispersion in the thickness that depends on the removed thickness, consequently the invention can be used to make SOI substrates with a more homogeneous thickness. Furthermore, the disturbed zone after the fracture is lower, consequently the invention can reduce the number of residual defects in the thin film.

The thickening possibility makes it possible to make thicker films, for example about 10 micrometers or thicker. These thin films may be used to produce thick SOI structures for making power devices or for making substrates for the production of "thin layers" of solar cells.

With the process according to the invention, the original substrate can be used several times, possibly after polishing the face of the substrate revealed after the thin film has been detached. The process is applicable to semi-conducting materials and to other mono-crystalline or other materials.

What is claimed is:

1. A process for making a thin film starting from a substrate of a solid material having a plane face comprising:
   the implantation of gaseous compounds in the substrate to make a layer of micro-cavities at a depth from the plane face corresponding to the thickness of the required thin film, the gaseous compounds being implanted under conditions that could weaken the substrate at the layer of micro-cavities; and
   partial or total separation of the thin film from the rest of the substrate, this separation comprising a step in which thermal energy is added to provoke coalescence of at least part of the micro-cavities while a pressure is applied to the plane face, said applied pressure being adjusted during said coalescence to remain above a pressure called the limiting pressure, below which blisters appear on the plane face and above which blisters do not wear on the plane face.

2. The process according to claim 1, in which the pressure is a gas pressure.

3. The process according to claim 1, in which the pressure is a mechanical pressure.

4. The process according to claim 3, in which the mechanical pressure is generated using a piston.

5. The process according to claim 1, in which the pressure is applied locally on the plane face.

6. The process according to claim 1, in which the pressure is applied uniformly on the plane face.

7. The process according to claim 1, also comprising bonding of a thickener onto the plane face, after implantation of the gaseous compounds.

8. The process according to claim 7, in which the thickener is composed of a wafer.

9. The process according to claim 8, in which the wafer is bonded by molecular bonding with the plane face.

10. The process according to claim 7, in which the thickener is formed by deposition of one or several materials.

11. The process according to claim 7, in which the pressure is applied through the thickener.

12. The process according to claim 1, in which the pressure is adjusted during the coalescence of at least part of the micro-cavities, to remain slightly above the limiting pressure.

13. The process according to claim 1, in which coalescence is performed such that the thin film is separated from the rest of the substrate by pulling them apart.

14. The process according to claim 1, in which the thin film is separated from the rest of the substrate by application of a heat treatment and, optionally, by mechanical forces.

15. The process according to claim 1, in which the substrate used as the initial substrate is a substrate that has already been used to produce a thin film according to the process.

16. The process according to claim 15, in which the previously used substrate is polished to provide a new plane face.

17. The process according to claim 1, in which the substrate supports one or several homogeneous and/or heterogeneous layers on the side having the plane face.

18. The process according to claim 1, in which the substrate comprises semi-conducting material, at least on the side having the plane face.

19. The process according to claim 1, in which the substrate comprises all or part of at least one electronic device and/or at least one electro-optical device, on the side having the plane face.

20. The process according to claim 1, in which the separation of the thin film is delayed by the application of an additional step that consists of applying an additional pressure onto the thin film.

* * * * *